(12) United States Patent
Shin et al.

(10) Patent No.: US 8,731,136 B2
(45) Date of Patent: May 20, 2014

(54) GATE SHIFT REGISTER

(75) Inventors: Hong-Jae Shin, Seoul (KR); Chung-Ah Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 9 days.

(21) Appl. No.: 13/587,287

(22) Filed: Aug. 16, 2012

(65) Prior Publication Data

US 2013/0148775 A1 Jun. 13, 2013

(30) Foreign Application Priority Data

Dec. 13, 2011 (KR) .......................... 10-2011-0134029

(51) Int. Cl.
*G11C 19/00* (2006.01)
(52) U.S. Cl.
USPC .................... 377/64; 377/69; 377/78; 377/79
(58) Field of Classification Search
None
See application file for complete search history.

(56) References Cited

U.S. PATENT DOCUMENTS

| | | | | |
|---|---|---|---|---|
| 7,873,140 | B2 * | 1/2011 | Moon et al. | 377/76 |
| 8,344,989 | B2 * | 1/2013 | Kim | 345/100 |
| 8,422,621 | B2 * | 4/2013 | Jang et al. | 377/64 |
| 2007/0104307 | A1 * | 5/2007 | Kim et al. | 377/64 |
| 2009/0167668 | A1 * | 7/2009 | Kim | 345/100 |
| 2011/0273417 | A1 * | 11/2011 | Shin et al. | 345/211 |
| 2011/0310074 | A1 * | 12/2011 | Ochiai et al. | 345/208 |

* cited by examiner

*Primary Examiner* — Tuan T Lam
(74) *Attorney, Agent, or Firm* — Morgan, Lewis & Bockius LLP

(57) ABSTRACT

Disclosed is a gate shift register, which can perform a bi-directional shift operation with a reduced number of switching devices. The gate shift register includes a plurality of stages to receive a plurality of gate shift clocks and sequentially output a scan pulse. A $k^{th}$ stage includes a scan direction controller including first and second forward TFTs and first and second reverse TFTs to convert a scan direction in response to carry signals of previous stages input through first and second input terminals and carry signals of next stages input through third and fourth input terminals, a node controller including first to eighteenth TFTs to control charging and discharge operations of Q1, Q2, QB1 and QB2 nodes, and an output unit including first and second pull-up TFTs and first to fourth pull-down TFTs to output two scan pulses based on voltage levels of the Q1, Q2, QB1 and QB2 nodes.

3 Claims, 6 Drawing Sheets

GATE SHIFT REGISTER

This application claims the benefit of the Korean Patent Application No. 10-2011-0134029, filed on Dec. 13, 2011, which is hereby incorporated by reference as if fully set forth herein.

BACKGROUND OF THE INVENTION

1. Field of the Invention

The present invention relates to a gate shift register, which can perform a bi-directional shift operation with a reduced number of switching devices.

2. Discussion of the Related Art

Recently, gate shift registers to perform a bi-directional shift operation have been proposed. The bi-directional gate shift registers include a bi-directional control circuit and are operated in a forward shift mode or in a reverse shift mode.

However, conventional bi-directional gate shift registers problematically increase a design area of an embedded gate driver due to a bi-directional control circuit additionally provided as compared to a unidirectional gate shift register.

SUMMARY OF THE INVENTION

Accordingly, the present invention is directed to a gate shift register that substantially obviates one or more problems due to limitations and disadvantages of the related art.

An object of the present invention is to provide a gate shift register, which can perform a bi-directional shift operation with a reduced number of switching devices.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a gate shift register includes a plurality of stages configured to receive a plurality of gate shift clocks and sequentially output a scan pulse, wherein a $k^{th}$ stage of the plurality of stages includes a scan direction controller including first and second forward thin film transistors (TFTs) and first and second reverse TFTs, the scan direction controller serving to convert a scan direction in response to carry signals of previous stages input through first and second input terminals and carry signals of next stages input through third and fourth input terminals, a node controller including first to eighteenth TFTs, the node controller serving to control charging and discharge operations of each of a Q1 node, a Q2 node, a QB1 node and a QB2 node, and an output unit including first and second pull-up TFTs and first to fourth pull-down TFTs, the output unit serving to output a first scan pulse and a second scan pulse based on voltage levels of the Q1 and Q2 nodes and the QB1 and QB2 nodes.

Each of the plurality of gate shift clocks may have a pulse width of three horizontal periods and is generated as a 6-phase cyclic clock, a phase of which is shifted on a per horizontal period basis, and adjacent gate shift clocks of the plurality of gate shift clocks may overlap each other during two horizontal periods.

The first scan pulse may function as a first carry signal, and the second scan pulse may function as a second carry signal.

The first input terminal may be connected to a second output node of a $k-2^{th}$ stage, the second input terminal may be connected to a first output node of a $k-1^{th}$ stage, the third input terminal may be connected to a second output node of a $k+1^{th}$ stage, and the fourth input terminal may be connected to a first output node of a $k+2^{th}$ stage.

The first forward TFT may apply a forward driving voltage to the Q1 node in response to a second carry signal of the $k-2^{th}$ stage input through the first input terminal, the second forward TFT may apply the forward driving voltage to the Q2 node in response to a first carry signal of the $k-1^{th}$ stage input through the second input terminal, the first reverse TFT may apply a reverse driving voltage to the Q1 node in response to a second carry signal of the $k+1^{th}$ stage input through the third input terminal, and the second reverse TFT may apply the reverse driving voltage to the Q2 node in response to a first carry signal of the $k+2^{th}$ stage input through the fourth input terminal.

The first TFT may discharge the Q1 node to a low potential voltage based on the voltage level of the QB2 node, the second TFT T2 may discharge the Q1 node to the low potential voltage based on the voltage level of the QB1 node, the third TFT may apply a forward driving voltage to the QB1 node in response to a first carry signal of the $k+2^{th}$ stage input through the fourth input terminal, the fourth TFT may apply a reverse driving voltage to the QB1 node in response to a second carry signal of the $k-2^{th}$ stage input through the first input terminal, the fifth TFT may apply odd AC driving voltage to a first node as a gate electrode and a source electrode of the fifth TFT are connected to an odd alternating current (AC) driving voltage supply line, the sixth TFT may discharge the first node to the low potential voltage based on the voltage level of the Q1 node, the seventh TFT may apply the odd AC driving voltage to the QB1 node based on the voltage level of the first node, the eighth TFT may discharge the first node to the low potential voltage based on the voltage level of the Q2 node, the ninth TFT may discharge the QB1 node to the low potential voltage based on the voltage level of the Q1 node, the tenth TFT may discharge the Q2 node to the low potential voltage based on the voltage level of the QB1 node, the eleventh TFT may discharge the Q2 node to the low potential voltage based on the voltage level of the QB2 node, the twelfth TFT may apply the forward driving voltage to the QB2 node in response to the first carry signal of the $k+2^{th}$ stage input through the fourth input terminal, the thirteenth TFT may apply the reverse driving voltage to the QB2 node in response to the second carry signal of the $k-2^{th}$ stage input through the first input terminal, the fourteenth TFT may apply even AC driving voltage to a second node as a gate electrode and a source electrode of the fourteenth TFT are connected to an even AC driving voltage supply line, the fifteenth TFT may discharge the second node to the low potential voltage based on the voltage level of the Q2 node, the sixteenth TFT may apply the even AC driving voltage to the QB2 node based on the voltage level of the second node, the seventeenth TFT may discharge the second node to the low potential voltage based on the voltage level of the Q1 node, and the eighteenth TFT may discharge the QB2 node to the low potential voltage based on the voltage level of the Q2 node.

The first pull-up TFT may supply an $A^{th}$ gate shift clock to the first output node based on the voltage level of the Q1 node, the second pull-up TFT may supply an $A+1^{th}$ gate shift clock to the second output node based on the voltage level of the Q2 node, the first pull-down TFT may discharge the first output node to the low potential voltage based on the voltage level of the QB1 node, the second pull-down TFT may discharge the second output node to the low potential voltage based on the voltage level of the QB1 node, the third pull-down TFT may discharge the first output node to the low potential voltage based on the voltage level of the QB2 node, and the fourth pull-down TFT may discharge the second output node to the low potential voltage based on the voltage level of the QB2 node.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, a gate shift register according to the embodiment will be described in more detail with reference to the accompanying drawings.

Figure 1:
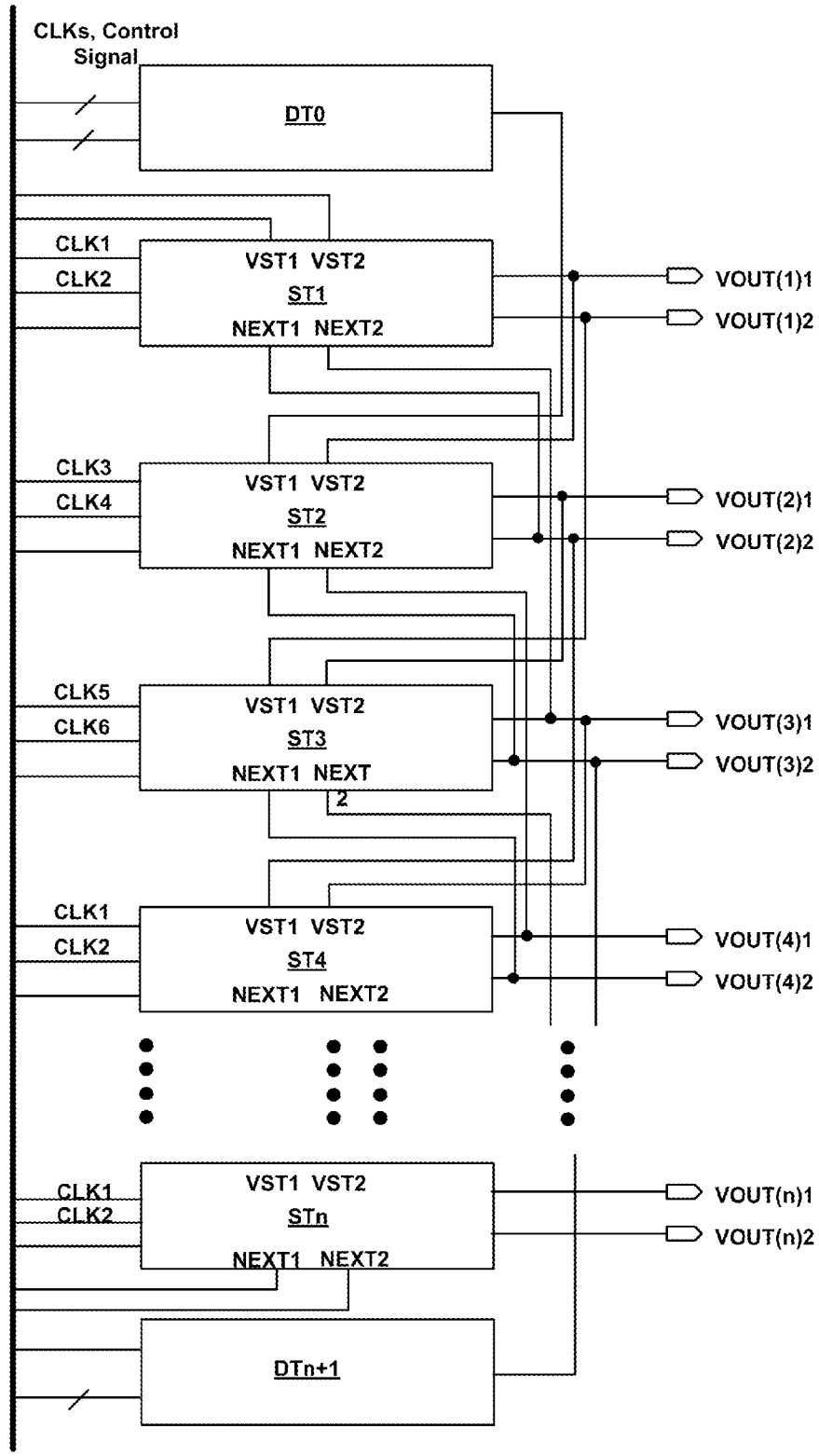
FIG. 1 is a view illustrating a configuration of a gate shift register according to an embodiment of the present invention.

FIG. 1 is a view illustrating a configuration of a gate shift register according to an embodiment of the present invention.

The gate shift register illustrated in FIG. 1 includes a plurality of cascade-connected stages ST1 to STn and at least two dummy stages DT0 and DTn+1.

Each of the stages ST1 to STn includes two output channels and outputs two scan pulses. The scan pulse is applied to scan lines of a flat panel display apparatus and at the same time, serves as a carry signal transferred to a previous stage and a next stage.

In the following description, the "previous stage" indicates a stage positioned above a reference stage, for example, any one stage among a $k-1^{th}$ stage STk−1 to a first dummy stage DT0 based on a $k^{th}$ stage STk, where "k" is 1<k<n. The "next stage" includes a stage positioned under the reference stage, for example, any one stage among a $k+1^{th}$ stage STk+1 to a second dummy stage DTn+1 based on the $k^{th}$ stage STk. The first dummy stage DT0 outputs a carry signal Vd1 to be input to the next stage, and the second dummy stage DTn+1 outputs a carry signal Vd2 to be input to the previous stage.

In a forward shift mode, the stages ST1 to STn output scan pulses VOUT (1)1 to VOUT(1)2 in the order of the first stage ST1→the $k^{th}$ stage STk→the $n^{th}$ stage STn. In the forward shift mode, each of the stages ST1 to STn operates in response to carry signals of two different previous stages applied to first and second input terminals VST1 and VST2 as a start signal and carry signals of two different next stages applied to third and fourth input terminals NEXT1 and NEXT2 as a reset signal. In the forward shift mode, a forward gate start pulse from the outside (i.e. a timing controller) is applied to the first and second input terminals VST1 and VST2 of the first stage ST1.

In a reverse shift mode, the stages ST1 to STn output scan pulses VOUT(n)2 to VOUT(1)1 in the order of the $n^{th}$ stage STn→the $k^{th}$ stage STk→the first stage ST1. In the reverse shift mode, each of the stages ST1 to STn operates in response to carry signals of two different previous stages applied to the first and second input terminals VST1 and VST2 as a reset signal and carry signals of two different next stages applied to the third and fourth input terminals NEXT1 and NEXT2 as a start signal. In the reverse shift mode, a reverse gate start pulse from the outside is applied to the third and fourth input terminals NEXT1 and NEXT2 of the $n^{th}$ stage STn.

The gate shift register outputs scan pulses VOUT(1)1 to VOUT(n)2 that overlap one another for a predetermined time. To this end, two gate shift clocks among i-phase gate shift clocks, which overlap one another for a predetermined time and are sequentially delayed, are input to each of the stages ST1 to STn, where "i" is a positive even number. It is preferable that the gate shift clocks are implemented as 6 or more phase gate shift clocks, so as to secure a sufficient charging time during high speed driving of 240 Hz or more. Hereinafter, each of the 6-phase gate shift clocks CLK1 to CLK6 has a pulse width of three horizontal periods (3H) and is shifted on a per horizontal period basis. Further, the adjacent gate shift clocks of the 6-phase gate shift clocks CLK1 to CLK6 overlap each other during two horizontal periods.

Figure 3:
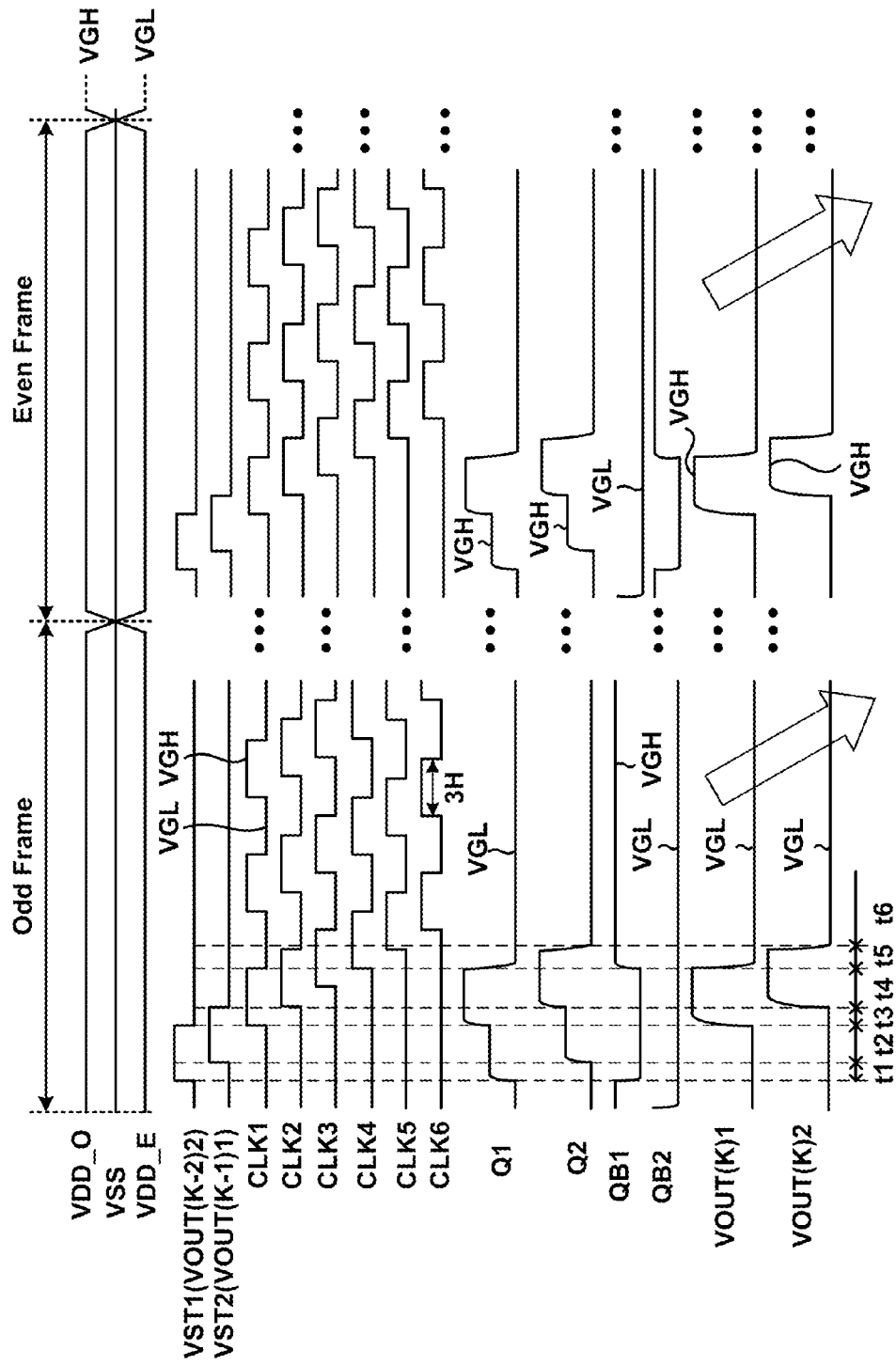
FIG. 3 illustrates input and output signals of the $k^{th}$ stage STk during a forward shift operation.
Figure 4:
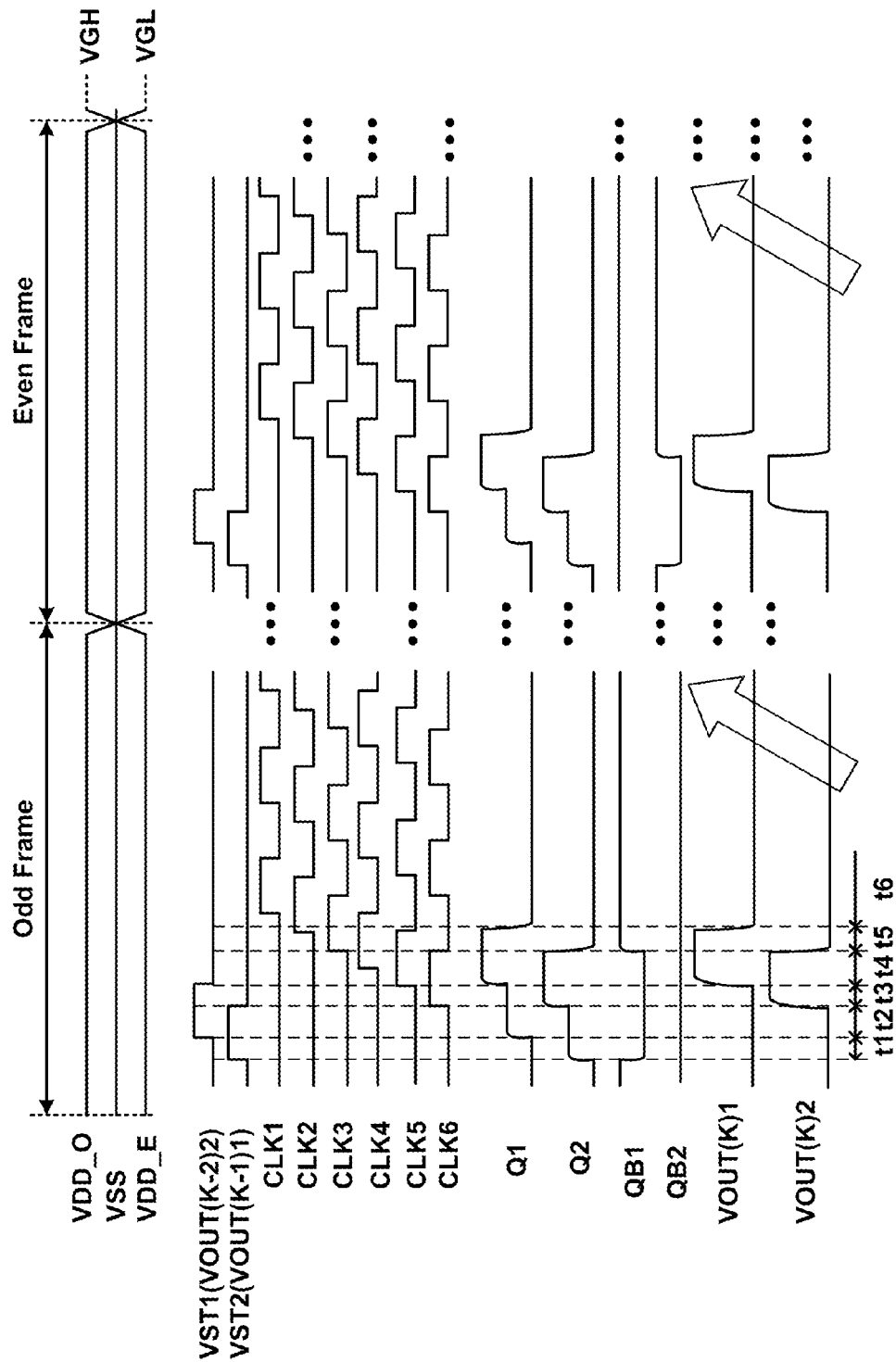
FIG. 4 illustrates input and output signals of the $k^{th}$ stage STk during a reverse shift operation.

The 6-phase gate shift clocks CLK1 to CLK6 swing between a gate high voltage VGH and a gate low voltage VGL. As illustrated in FIGS. 3 and 4, alternating current (AC) driving voltages VDD_E and VDD_O, which have a phase difference of 180 degrees between the gate high voltage VGH and the gate low voltage VGL on a per predetermined period basis and swing in opposite directions, are supplied to the stages ST1 to STn. Further, a ground level voltage GND or a low potential voltage VSS of the same level as the gate low voltage VGL is supplied to the stages ST1 to STn.

In the forward shift mode, a forward driving voltage VDD_F of the same level as the gate high voltage VGH and a reverse driving voltage VDD_R of the same level as the gate low voltage VGL are supplied to the stages ST1 to STn. In the reverse shift mode, a reverse driving voltage VDD_R of the same level as the gate high voltage VGH and a forward driving voltage VDD_F of the same level as the gate low voltage VGL are supplied to the stages ST1 to STn.

The gate high voltage VGH is set to a voltage greater than a threshold voltage of thin film transistors (TFTs) formed in a TFT array of the flat panel display apparatus. The gate low voltage VGL is set to a voltage less than the threshold voltage of the TFTs formed in the TFT array of display apparatus. For example, the gate high voltage VGH may be set to 20V to 30V and the gate low voltage VGL may be set to −5V.

Figure 2:
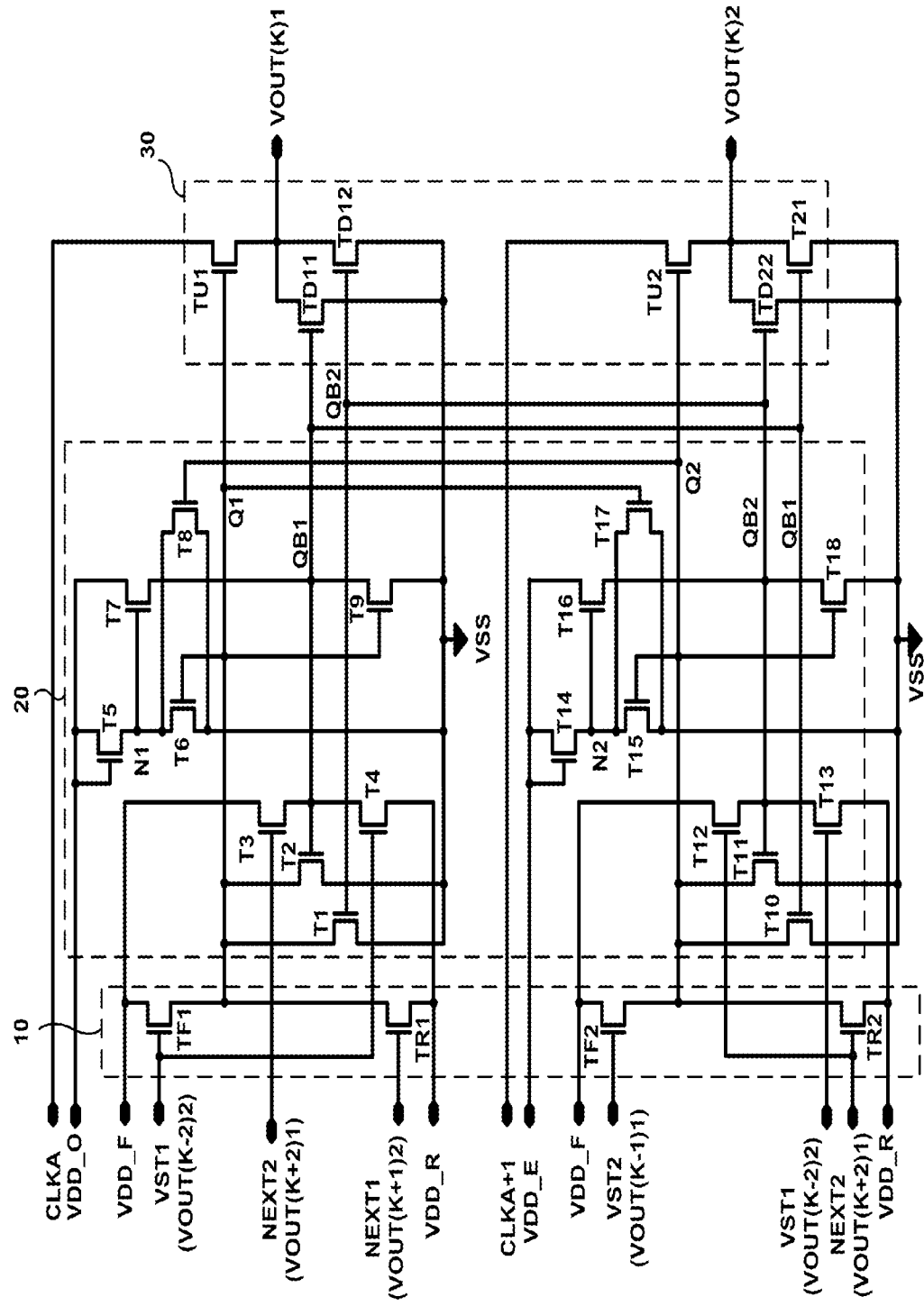
FIG. 2 is a circuit diagram of a $k^{th}$ stage STk according to the embodiment.

FIG. 2 is a circuit diagram of the $k^{th}$ stage STk according to the embodiment. Other stages each have the same circuit configuration as the $k^{th}$ stage STk.

Referring to FIG. 2, two gate shift clocks CLKA and CLKA+1 among the 6-phase gate shift clocks CLK1 to CLK6 are input to a clock terminal of the $k^{th}$ stage STk.

The $k^{th}$ stage STk includes a scan direction controller 10 which converts a scan direction in response to carry signals of previous stages input through the first and second input terminals VST1 and VST2 and carry signals of next stages input through the third and fourth input terminals NEXT1 and NEXT2, a node controller 20 which controls charging and discharge operations of a Q1 node, a Q2 node, a QB1 node and a QB2 node, and an output unit 30 which outputs two scan pulses VOUT(K)1 and VOUT(K)2 based on voltage levels of the Q1 and Q2 nodes and the QB1 and QB2 nodes.

The scan direction controller 10 includes four TFTs. More particularly, the scan direction controller 10 includes first and second forward TFTs TF1 and TF2 and first and second reverse TFTs TR1 and TR2.

The first forward TFT TF1 applies the forward driving voltage VDD_F to the Q1 node in response to a second carry signal VOUT(K−2)2 of a k−$2^{th}$ stage STk−2 input through the first input terminal VST1.

The second forward TFT TF2 applies the forward driving voltage VDD_F to the Q2 node in response to a first carry signal VOUT(K−1)1 of a k−$1^{th}$ stage STk−1 input through the second input terminal VST2.

The first reverse TFT TR1 applies the reverse driving voltage VDD_R to the Q1 node in response to a second carry signal VOUT(K+1)2 of a k+$1^{th}$ stage STk+1 input through the third input terminal NEXT1.

The second reverse TFT TR2 applies the reverse driving voltage VDD_R to the Q2 node in response to a first carry signal VOUT(K+2)1 of a k+$2^{th}$ stage STk+2 input through the fourth input terminal NEXT2.

The node controller 20 includes eighteen TFTs, i.e. first to eighteenth TFTs T1 to T18.

The first TFT T1 discharges the Q1 node to the low potential voltage VSS based on the voltage level of the QB2 node.

The second TFT T2 discharges the Q1 node to the low potential voltage VSS based on the voltage level of the QB1 node.

The third TFT T3 applies the forward driving voltage VDD_F to the QB1 node in response to the first carry signal VOUT(K+2)1 of the k+$2^{th}$ stage STk+2 input through the fourth input terminal NEXT2.

The fourth TFT T4 applies the reverse driving voltage VDD_R to the QB1 node in response to the second carry signal VOUT(K−2)2 of the k−$2^{th}$ stage STk−2 input through the first input terminal VST1.

A gate electrode and a source electrode of the fifth TFT T5 are connected to an odd AC driving voltage supply line, and the fifth TFT T5 applies odd AC driving voltage VDD_O to a first node N1.

The sixth TFT T6 discharges the first node N1 to the low potential voltage VSS based on the voltage level of the Q1 node.

The seventh TFT T7 applies the odd AC driving voltage VDD_O to the QB1 node based on the voltage level of the first node N1.

The eighth TFT T8 discharges the first node N1 to the low potential voltage VSS based on the voltage level of the Q2 node.

The ninth TFT T9 discharges the QB1 node to the low potential voltage VSS based on the voltage level of the Q1 node.

The tenth TFT T10 discharges the Q2 node to the low potential voltage VSS based on the voltage level of the QB1 node.

The eleventh TFT T11 discharges the Q2 node to the low potential voltage VSS based on the voltage level of the QB2 node.

The twelfth TFT T12 applies the forward driving voltage VDD_F to the QB2 node in response to the first carry signal VOUT(K+2)1 of the k+$2^{th}$ stage STk+2 input through the fourth input terminal NEXT2.

The thirteenth TFT T13 applies the reverse driving voltage VDD_R to the QB2 node in response to the second carry signal VOUT(K−2)2 of the k−$2^{th}$ stage STk−2 input through the first input terminal VST1.

A gate electrode and a source electrode of the fourteenth TFT T14 are connected to an even AC driving voltage supply line, and the fourteenth TFT T14 applies even AC driving voltage VDD_E to a second node N2.

The fifteenth TFT T15 discharges the second node N2 to the low potential voltage VSS based on the voltage level of the Q2 node.

The sixteenth TFT T16 applies the even AC driving voltage VDD_E to the QB2 node based on the voltage level of the second node N2.

The seventeenth TFT T17 discharges the second node N2 to the low potential voltage VSS based on the voltage level of the Q1 node.

The eighteenth TFT T18 discharges the QB2 node to the low potential voltage VSS based on the voltage level of the Q2 node.

The output unit 30 includes six TFTs. More particularly, the output unit 30 includes first and second pull-up TFTs TU1 and TU2 and first to fourth pull-down TFTs TD1 to TD4.

The first pull-up TFT TU1 supplies an $A^{th}$ gate shift clock to a first output node NO1 based on the voltage level of the Q1 node.

The second pull-up TFT TU2 supplies an A+$1^{th}$ gate shift clock to a second output node NO2 based on the voltage level of the Q2 node.

The first pull-down TFT TD1 discharges the first output node NO1 to the low potential voltage VSS based on the voltage level of the QB1 node.

The second pull-down TFT TD2 discharges the second output node NO2 to the low potential voltage VSS based on the voltage level of the QB1 node.

The third pull-down TFT TD3 discharges the first output node NO1 to the low potential voltage VSS based on the voltage level of the QB2 node.

The fourth pull-down TFT TD4 discharges the second output node NO2 to the low potential voltage VSS based on the voltage level of the QB2 node.

As described above, each of the stages ST1 to STn according to the embodiment includes the scan direction controller 10 including the four TFTs, the node controller 20 including the eighteen TFTs, and the output unit 30 including the six TFTs. That is, although a conventional bi-directional gate shift register includes at least thirty TFTs to ensure a bi-directional shift operation of each stage, the stage according to the embodiment includes a reduced number of TFTs, namely twenty eight, which may reduce a design area of an embedded gate driver.

FIG. 3 illustrates input and output signals of the $k^{th}$ stage during a forward shift operation. The sequence of the forward shift operation of the $k^{th}$ stage will be described below with reference to FIGS. 2 and 3.

In a forward shift mode, a forward gate start pulse (not shown) is generated, and the 6-phase gate shift clocks CLK1 to CLK6 are generated as cyclic clocks that are sequentially delayed from the first gate shift clock CLK1 to the sixth gate shift clock CLK6. In the forward shift mode, the forward driving voltage VDD_F of the same level as the gate high voltage VGH is input, and the reverse driving voltage VDD_R of the same level as the gate low voltage VGL is input. In the forward shift mode, it is assumed that the gate shift clocks CLKA and CLKA+1 input to the $k^{th}$ stage STk are the gate shift clocks CLK1 and CLK2, respectively.

First, in the forward shift mode, an operation of the $k^{th}$ stage STk during an odd frame is described. During the odd frame, the odd AC driving voltage VDD_O of the same level as the gate high voltage VGH is input, and the even AC driving voltage VDD_E of the same level as the gate low voltage VGL is input. Meanwhile, the QB2 node is continuously held at the level of the gate low voltage VGL. Thus, the TFTs T1, T10, TD3 and TD4, the gate electrodes of which are connected to the QB2 node, are continuously held in a turn-off state.

During periods T1 and T2, the second carry signal VOUT(K−2)2 of the k−2$^{th}$ stage STk−2 is input through the first input terminal VST1 as a start signal. The first forward TFT TF1, the fourth TFT T4 and the thirteenth TFT T13 are turned on in response to the start signal. As a result, the Q1 node is charged to the gate high voltage VGH, and the QB1 node and the QB2 node are discharged to the gate low voltage VGL.

During periods T2 and T3, the first carry signal VOUT(K−1)1 of the k−1$^{th}$ stage STk−1 is input through the second input terminal VST2 as a start signal. The second forward TFT TF2 is turned on in response to the start signal. As a result, the Q2 node is charged to the gate high voltage VGH.

During periods T3 and T4, the first gate shift clock CLK1 is applied to a drain electrode of the first pull-up TFT TU1. The first gate shift clock CLK1 is equal to the gate high voltage VGH. The voltage of the Q1 node is bootstrapped by a parasitic capacitance between the gate electrode and the drain electrode of the first pull-up TFT TU1 and increases to a voltage level higher than the gate high voltage VGH, thereby allowing the first pull-up TFT TU1 to be turned on. Thereby, the k stage STk outputs a first scan pulse VOUT(k)1 raised to the gate high voltage VGH.

During periods T4 and T5, the second gate shift clock CLK2 is applied to a drain electrode of the second pull-up TFT TU2. The second gate shift clock CLK2 is equal to the gate high voltage VGH. The voltage of the Q2 node is bootstrapped by a parasitic capacitance between the gate electrode and the drain electrode of the second pull-up TFT TU2 and increases to a voltage level higher than the gate high voltage VGH, thereby allowing the second pull-up TFT TU2 to be turned on. Thereby, the k stage STk outputs a second scan pulse VOUT(k)2 raised to the gate high voltage VGH.

During the period T5, the second carry signal VOUT(K+1)2 of the k+1$^{th}$ stage STk+1 is input through the third input terminal NEXT1 as a reset signal. The first reverse TFT TR1 and the third TFT T3 are turned on in response to the reset signal. As a result, the Q1 node is discharged to the gate low voltage VGL, and the QB1 node is charged to the gate high voltage VGH. The first pull-up TFT TU1 is turned off due to the discharge of the Q1 node.

Meanwhile, even if the sixth TFT T6 is turned off due to the discharge of the Q1 node, the first node N1 is continuously held at the gate low voltage VGL because of the turn-on operation of the eighth TFT T8. Accordingly, the sixth TFT T6 is turned off, and the QB1 node is continuously held at the gate low voltage VGL. During the period T5, the first scan pulse VOUT(K)1 falls.

During a period T6, the first carry signal VOUT(K+2)1 of the k+2$^{th}$ stage STk+2 is input through the fourth input terminal NEXT2 as a reset signal. The second reverse TFT TR2 and the third TFT T3 are turned on in response to the reset signal. As a result, the Q2 node is discharged to the gate low voltage VGL, and the QB1 node is charged to the gate high voltage VGH. The second pull-up TFT TU2 is turned off due to the discharge of the Q2 node, and the first and second pull-down TFTs TD1 and TD2 are turned on due to the charging of the QB1 node. Accordingly, the k$^{th}$ stage STk holds the first scan pulse VOUT(K)1 in a falling state and causes falling of the second scan pulse VOUT(K)2.

Next, an operation of the k$^{th}$ stage STk during an even frame in the forward shift mode is described. During the even frame, the even AC driving voltage VDD_E of the same level as the gate high voltage VGH is input, and the odd AC driving voltage VDD_O of the same level as the gate low voltage VGL is input. Meanwhile, the QB1 node is continuously held at the level of the gate low voltage VGL. Thus, the TFTs T2, T10, TD1 and TD2, the gate electrodes of which are connected to the QB1 node, are continuously held in a turn-off state. The operation of the k$^{th}$ stage STk during the even frame is substantially the same as the operation of the k$^{th}$ stage STGk during the odd frame in terms of the generation timing of the first and second scan pulses VOUT(K)1 and VOUT(K)2, except that the falling of the first and second scan pulses VOUT(K)1 and VOUT(K)2 are controlled by the QB2 node. Thus, a detailed description of the operation of the k$^{th}$ stage STk during the even frame is replaced by the above description with respect to the operation of the k$^{th}$ stage STk during the odd frame.

FIG. 4 illustrates input and output signals of the k$^{th}$ stage during a reverse shift operation. The sequence of the reverse shift operation of the k$^{th}$ stage will be described below with reference to FIGS. 2 and 4.

In a reverse shift mode, a reverse gate start pulse (not shown) is generated, and the 6-phase gate shift clocks CLK1 to CLK6 are generated as cyclic clocks that are sequentially delayed from the sixth gate shift clock CLK6 to the first gate shift clock CLK1. In the reverse shift mode, the reverse driving voltage VDD_R of the same level as the gate high voltage VGH is input, and the forward driving voltage VDD_F of the same level as the gate low voltage VGL is input. In the reverse shift mode, it is assumed that the gate shift clocks CLKA and CLKA+1 input to the k$^{th}$ stage STk are the gate shift clocks CLK5 and CLK6, respectively.

First, in the reverse shift mode, an operation of the k$^{th}$ stage STk during an odd frame is described. During the odd frame, the odd AC driving voltage VDD_O of the same level as the gate high voltage VGH is input, and the even AC driving voltage VDD_E of the same level as the gate low voltage VGL is input. Meanwhile, the QB2 node is continuously held at the level of the gate low voltage VGL. Thus, the TFTs T1, T10, TD3 and TD4, the gate electrodes of which are connected to the QB2 node, are continuously held in a turn-off state.

During periods T1 and T2, the first carry signal VOUT(K+2)2 of the k+2$^{th}$ stage STk+2 is input through the fourth input terminal NEXT2 as a start signal. The second reverse TFT TR2 and the third TFT T3 are turned on in response to the start signal. As a result, the Q2 node is charged to the gate high voltage VGH, and the QB1 node is discharged to the gate low voltage VGL.

During periods T2 and T3, the second carry signal VOUT(K+1)2 of the k+1$^{th}$ stage STk+1 is input through the third input terminal NEXT1 as a start signal. The first reverse TFT TR1 is turned on in response to the start signal. As a result, the Q1 node is charged to the gate high voltage VGH.

During periods T3 and T4, the sixth gate shift clock CLK6 is applied to the drain electrode of the second pull-up TFT TU2. The sixth gate shift clock CLK6 is equal to the gate high voltage VGH. The voltage of the Q2 node is bootstrapped by a parasitic capacitance between the gate electrode and the drain electrode of the second pull-up TFT TU2 and increases to a voltage level higher than the gate high voltage VGH, thereby allowing the second pull-up TFT TU2 to be turned on. Thereby, the k stage STk outputs the second scan pulse VOUT(k)2 raised to the gate high voltage VGH.

During periods T4 and T5, the fifth gate shift clock CLK5 is applied to the drain electrode of the first pull-up TFT TU1. The fifth gate shift clock CLK5 is equal to the gate high voltage VGH. The voltage of the Q2 node is bootstrapped by a parasitic capacitance between the gate electrode and the drain electrode of the first pull-up TFT TU1 and increases to a voltage level higher than the gate high voltage VGH, thereby allowing the first pull-up TFT TU1 to be turned on. Thereby, the k stage STk outputs the first scan pulse VOUT(k)1 raised to the gate high voltage VGH.

During the period T5, the first carry signal VOUT(K−1)1 of the k−1$^{th}$ stage STk−1 is input through the second input terminal VIST2 as a reset signal. The second forward TFT TR2 is turned on in response to the reset signal. As a result, the Q2 node is discharged to the gate low voltage VGL and thus, the second pull-up TFT TU2 is turned off. Meanwhile, even if the fifteenth TFT T15 is turned off due to the discharge of the Q2 node, the second node N2 is continuously held at the gate low voltage VGL because of the turn-on operation of the seventeenth TFT T17. Accordingly, the sixteenth TFT T16 is turned off, and the QB2 node is continuously held at the gate low voltage VGL. During the period T5, the second scan pulse VOUT(K)2 falls.

During a period T6, the second carry signal VOUT(K−2)2 of the k−2$^{th}$ stage STk−2 is input through the first input terminal VST1 as a reset signal. The first forward TFT TF1, the fourth TFT T4, the twelfth TFT T12 and the thirteenth TFT T13 are turned on in response to the reset signal. As a result, the Q1 node is discharged to the gate low voltage VGL, and the QB1 node is charged to the gate high voltage VGH. The first pull-up TFT TU1 is turned off due to the discharge of the Q1 node, and the first and second pull-down TFTs TD1 and TD2 are turned on due to the charging of the QB1 node. Accordingly, the k$^{th}$ stage STk holds the second scan pulse VOUT(K)2 in a falling state and causes falling of the first scan pulse VOUT(K)1.

Next, an operation of the k$^{th}$ stage STk during an even frame in the reverse shift mode is described. During the even frame, the even AC driving voltage VDD_E of the same level as the gate high voltage VGH is input, and the odd AC driving voltage VDD_O of the same level as the gate low voltage VGL is input. Meanwhile, the QB1 node is continuously held at the level of the gate low voltage VGL. Thus, the TFTs T2, T10, TD1 and TD2, the gate electrodes of which are connected to the QB1 node, are continuously held in a turn-off state. The operation of the k$^{th}$ stage STk during the even frame is substantially the same as the operation of the k$^{th}$ stage STGk during the odd frame in terms of the generation timing of the first and second scan pulses VOUT(K)1 and VOUT(K) 2, except that the falling of the first and second scan pulses VOUT(K) 1 and VOUT(K)2 are controlled by the QB2 node. Thus, a detailed description of the operation of the k$^{th}$ stage STk during the even frame is replaced by the above description with respect to the operation of the k$^{th}$ stage STk during the odd frame.

As described above, the embodiment exhibits rapid charging of the Q1 node and the Q2 node despite the fact that the number of the TFTs is reduced to twenty eight, which is advantageous for high speed driving and may enhance operational reliability under a low temperature environment. The reason that rapid charging of the Q1 node and the Q2 node is possible is as follows. That is, the third TFT T3, the fourth TFT T4, the twelfth TFT T12 and the thirteenth TFT T13 provided at each of the stages ST1 to STn serve to discharge the QB1 node and the QB2 node to the gate low voltage VGL during free charging periods of the Q1 node and the Q2 node. Since rapid charging of the Q1 node and the Q2 node requires rapid discharge of the QB1 node and the QB2 node, the faster the operating speed of the TFTs T3, T4, T12 and T13, the rapid charging of the Q1 node and the Q2 node is more possible. The TFTs T3, T4, T12 and T13 exhibit a high operating speed and can rapidly charge the Q1 node and the Q2 node because the gate electrodes thereof directly receive a high voltage carry signal from the first input terminal VST1 or the fourth input terminal NEXT2.

Figure 5A:
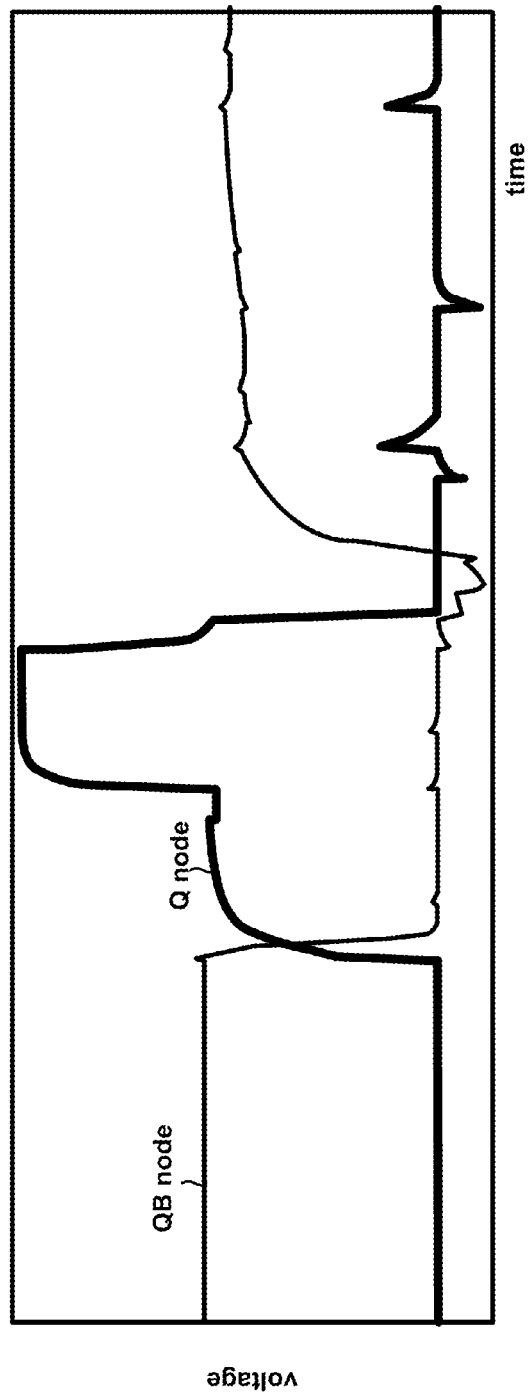
FIGS. 5A and 5B illustrates a simulation result explaining effects of the present invention to the related art.
Figure 5B:
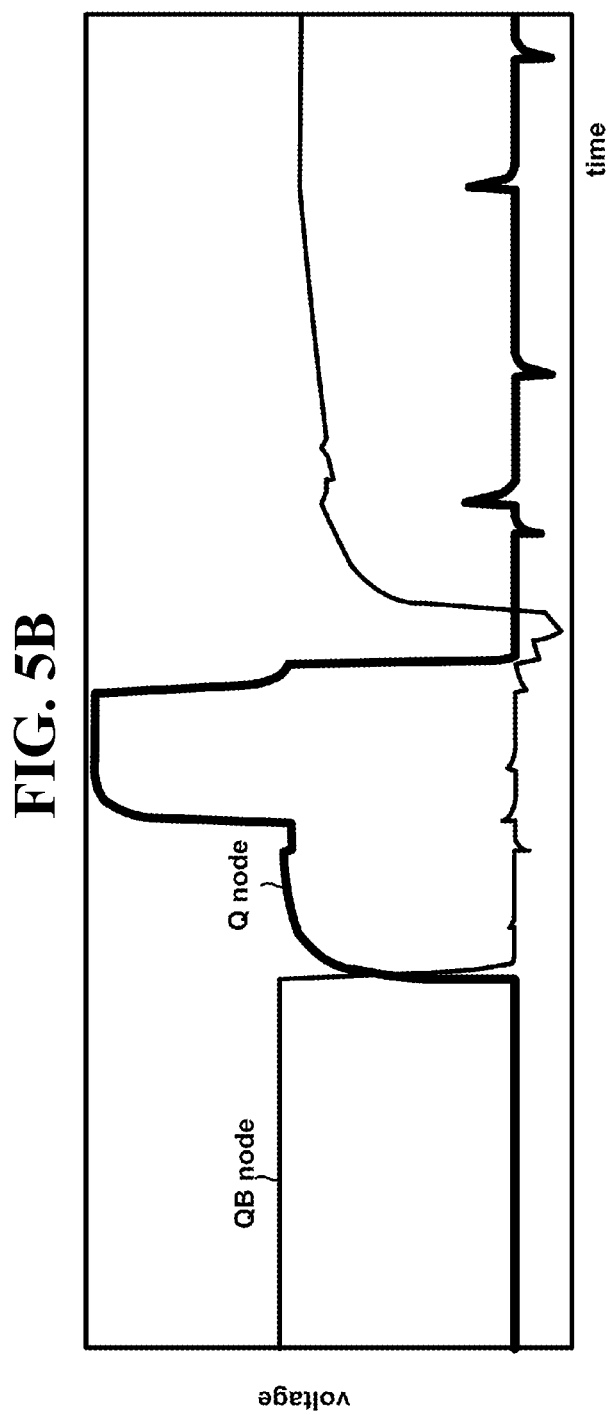

FIGS. 5A and 5B illustrates a simulation result explaining the effects of the present invention to the related art. More particularly, FIG. 5A illustrates voltage waveforms of the Q node and the QB node according to the related art and FIG. 5B illustrates voltage waveforms of the Q node and the QB node according to the present invention.

Referring to FIGS. 5A and 5B, it can be understood that the gate shift register according to the present invention than one according to the related art exhibits rapid charging of the Q node as a result that the QB node is rapidly discharged during a free charging period of the Q node.

As is apparent from the above description, a gate shift register according to the present invention can realize high speed charging of Q1 and Q2 nodes with a reduced number of TFTs, i.e. twenty eight TFTs, which is advantageous for high speed driving and may enhance operational reliability under a low temperature environment.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A gate shift register comprising a plurality of stages configured to receive a plurality of gate shift clocks and sequentially output a scan pulse,
   wherein a kth stage of the plurality of stages includes:
   a scan direction controller including first and second forward thin film transistors (TFTs) and first and second reverse TFTs, the scan direction controller serving to convert a scan direction in response to carry signals of previous stages input through first and second input terminals and carry signals of next stages input through third and fourth input terminals;
   a node controller including first to eighteenth TFTs, the node controller serving to control charging and discharge operations of each of a Q1 node, a Q2 node, a QB1 node and a QB2 node; and
   an output unit including first and second pull-up TFTs and first to fourth pull-down TFTs, the output unit serving to output a first scan pulse and a second scan pulse based on voltage levels of the Q1 and Q2 nodes and the QB1 and QB2 nodes,
   wherein:
   each of the plurality of gate shift clocks has a pulse width of three horizontal periods and is generated as a 6-phase cyclic clock, wherein a phase of the 6-phase cyclic clock is shifted on a per horizontal period basis; and
   adjacent gate shift clocks of the plurality of gate shift clocks overlap each other during two horizontal periods,
   wherein:
   the first scan pulse functions as a first carry signal;
   the second scan pulse functions as a second carry signal; and the first input terminal is connected to a second output node of a k−2th stage, the second input terminal is connected to a first output node of a k−1th stage, the third input terminal is connected to a second output node of a k+1th stage, and the fourth input terminal is connected to a first output node of a k+2th stage;
   the first TFT discharges the Q1 node to a low potential voltage based on the voltage level of the QB2 node;
   the second TFT discharges the Q1 node to the low potential voltage based on the voltage level of the QB1 node;

the third TFT applies a forward driving voltage to the QB1 node in response to a first carry signal of the k+2th stage input through the fourth input terminal;

the fourth TFT applies a reverse driving voltage to the QB1 node in response to a second carry signal of the k−2th stage input through the first input terminal;

the fifth TFT applies odd AC driving voltage to a first node as a gate electrode and a source electrode of the fifth TFT are connected to an odd alternating current (AC) driving voltage supply line;

the sixth TFT discharges the first node to the low potential voltage based on the voltage level of the Q1 node;

the seventh TFT applies the odd AC driving voltage to the QB1 node based on the voltage level of the first node;

the eighth TFT discharges the first node to the low potential voltage based on the voltage level of the Q2 node;

the ninth TFT discharges the QB1 node to the low potential voltage based on the voltage level of the Q1 node;

the tenth TFT discharges the Q2 node to the low potential voltage based on the voltage level of the QB1 node;

the eleventh TFT discharges the Q2 node to the low potential voltage based on the voltage level of the QB2 node;

the twelfth TFT applies the forward driving voltage to the QB2 node in response to the first carry signal of the k+2th stage input through the fourth input terminal;

the thirteenth TFT applies the reverse driving voltage to the QB2 node in response to the second carry signal of the k−2th stage input through the first input terminal;

the fourteenth TFT applies even AC driving voltage to a second node as a gate electrode and a source electrode of the fourteenth TFT are connected to an even AC driving voltage supply line;

the fifteenth TFT discharges the second node to the low potential voltage based on the voltage level of the Q2 node;

the sixteenth TFT applies the even AC driving voltage to the QB2 node based on the voltage level of the second node;

the seventeenth TFT discharges the second node to the low potential voltage based on the voltage level of the Q1 node; and the eighteenth TFT discharges the QB2 node to the low potential voltage based on the voltage level of the Q2 node.

2. The gate shift register according to claim 1, wherein:

the first forward TFT applies a forward driving voltage to the Q1 node in response to a second carry signal of the k−2th stage input through the first input terminal;

the second forward TFT applies the forward driving voltage to the Q2 node in response to a first carry signal of the k−1th stage input through the second input terminal;

the first reverse TFT applies a reverse driving voltage to the Q1 node in response to a second carry signal of the k+1th stage input through the third input terminal; and the second reverse TFT applies the reverse driving voltage to the Q2 node in response to a first carry signal of the k+2th stage input through the fourth input terminal.

3. The gate shift register according to claim 1, wherein:

the first pull-up TFT supplies an Ath gate shift clock to the first output node based on the voltage level of the Q1 node;

the second pull-up TFT supplies an A+1th gate shift clock to the second output node based on the voltage level of the Q2 node;

the first pull-down TFT discharges the first output node to the low potential voltage based on the voltage level of the QB1 node;

the second pull-down TFT discharges the second output node to the low potential voltage based on the voltage level of the QB1 node;

the third pull-down TFT discharges the first output node to the low potential voltage based on the voltage level of the QB2 node; and the fourth pull-down TFT discharges the second output node to the low potential voltage based on the voltage level of the QB2 node.

* * * * *